US 6,952,026 B2

(12) United States Patent
Lindholm

(10) Patent No.: US 6,952,026 B2
(45) Date of Patent: Oct. 4, 2005

(54) POSITION SENSITIVE PHOTO DETECTOR

(75) Inventor: Lars Lindholm, Partille (SE)

(73) Assignee: Sitek Electro Optics AB, Partille (SE)

(*) Notice: Subject to any disclaimer, the term of this patent is extended or adjusted under 35 U.S.C. 154(b) by 76 days.

(21) Appl. No.: 10/296,823

(22) PCT Filed: Jun. 1, 2001

(86) PCT No.: PCT/SE01/01235

§ 371 (c)(1),
(2), (4) Date: Jun. 16, 2003

(87) PCT Pub. No.: WO01/93340

PCT Pub. Date: Dec. 6, 2001

(65) Prior Publication Data

US 2004/0089907 A1 May 13, 2004

(30) Foreign Application Priority Data

Jun. 2, 2000 (SE) .............................. 0002057

(51) Int. Cl.⁷ ..................................... H01L 31/0328
(52) U.S. Cl. .................. 257/184; 257/49; 257/183
(58) Field of Search .................... 257/49, 183, 184, 257/53

(56) References Cited

U.S. PATENT DOCUMENTS

| | | |
|---|---|---|
| 5,111,052 A | 5/1992 | Ohtsuchi et al. |
| 5,459,332 A | 10/1995 | Carruthers |
| 5,600,173 A | 2/1997 | Suzunaga |
| 5,895,930 A | 4/1999 | Oh et al. |
| 6,174,750 B1 * | 1/2001 | Onabe et al. ............. 438/56 |
| 2002/0011639 A1 * | 1/2002 | Carlson et al. ........... 257/443 |

FOREIGN PATENT DOCUMENTS

| | | |
|---|---|---|
| EP | 9 730 304 A1 | 9/1996 |
| WO | WO 96/08702 | 3/1996 |

OTHER PUBLICATIONS

Anssi J. Makynen et al: "CMOS Photodetectors for Industrial Position Sensing", *IEEE Transactions on Instrumentation and Measurement*, vol. 43, nr. 3, pp. 489–492, ch. II and Fig. 1, Jun. 1994.

Anssi J. Makynen et al: "CMOS Photodetectors for Industrial Position Sensing", *IEEE Transactions on Instrumentation and Measurement*, vol. 43, nr. 8, p. 490, ch. II and Fig. 1, Jun. 1994.

* cited by examiner

*Primary Examiner*—Brad Smith
(74) *Attorney, Agent, or Firm*—Harness, Dickey & Pierce, P.L.C.

(57) ABSTRACT

A radiation detector is of the type, which by use of electric signals, which indicates the position of an irradiated point on a detector surface of the detector. The detector includes a semiconductor wafer having at least two barrier layers, which are arranged in such manner that when applying an electric bias across the layers, one layer is reversely biased and the other if forwardly biased, the extension of the reversely biased barrier layer substantially coinciding with the detector surface. The detector further includes at least two conductive layers provided with at least one current collecting electrode, the conductive layers being arranged so as to allow a transistor amplification between the forwardly and reversely biased layer by use of charge currents generated by the radiation in the irradiated point and separated by the reversely biased barrier layer.

18 Claims, 7 Drawing Sheets

POSITION SENSITIVE PHOTO DETECTOR

This application is the national phase under 35 U.S.C. § 371 of PCT International Application No. PCT/SE01/01235 which has an International filing date of Jun. 1, 2001, which designated the United States of America and which claims priority on Swedish Patent Application number SE 0002057-8 filed Jun. 2, 2000, the entire contents of which are hereby incorporated herein by reference.

FIELD OF THE INVENTION

The present invention generally relates to a radiation sensitive position detector. Preferably, it relates to one of the type, which by use of electric signals, indicates the position of a point located on the active surface of the detector and exposed to electromagnetic radiation. This type of detector is common in measurements where the radiation consists of light, but there are also other applications, where for example the radiation may consist of some form of radio-active or infrared radiation. Therefore, radiation here means any type of electromagnetic radiation. In the following, reference will be made mainly to light, but it will be appreciated that the discussion also generally applies to all electromagnetic radiation.

BACKGROUND ART

A detector is built on a semiconductor wafer of the type in which a concentrated radiation causes charge carrier pairs (holes and electrons) to form in the irradiated point.

The semiconductor wafer is provided with conductive layers, one of which also serves as a barrier layer, and whose extension coincides with the active surface, with the opposite conductivity type to that of the semiconductor wafer material. This layer prevents the charge carrier pairs formed in connection with the irradiation from recombining inside the semiconductor wafer. Instead, the recombination occurs outside the wafer by the two conductive layers being connected to an external electric circuit. This will cause the charge carriers to move through this connection, thus producing an electric current.

The position determination is obtained by the charge carriers being distributed, by means of a resistive splitting-up of the current, among collecting electrodes arranged on the conductive layers. By measuring the currents in the outer connections between the electrodes of the respective barrier layers, the position of the point of light may be determined.

Depending on the number of electrodes on the conductive layers and their arrangement, the detector can be considered to have a number of axes, along which the current is divided. In the case where two electrodes are provided, the detector is considered to be a detector with one axis, and in the case of four electrodes it is considered to be a detector with two axes etc. For example, a detector where one conductive layer may have four electrodes between which the current is divided, while the other layer has only one collecting electrode would be a detector with two axes. The same number of axes can also be obtained if the two conductive layers have two electrodes each.

The conductive layers and the electrodes may be designed in any optional way, which means that the axis along which the current is divided does not need to be of a particular appearance and does not necessarily have to be a straight line.

A device of this type is known from Applicant's Patent Application EP 0 801 725, with the same assignee. A disadvantage of such previously known devices is, however, that the sensitivity, i.e. how much current that is generated by the point of light and that can be divided between the electrodes, is limited by the number of charge carrier pairs that are being generated for each incident radiation quanta. This number is limited by the laws of physics. The consequence of this is that a detector of the above type cannot be used in very many applications or that the result is not entirely reliable. Situations where these previously known detectors have proven inadequate are, for example, in measurements carried out over long distances or measurements where reflections from surfaces with low reflectivity are being used.

OBJECT OF EMBODIMENTS OF THE INVENTION

In view of the above, an object of an embodiment of the present invention is to provide a detector which completely or at least partially solves at least one of the problems associated with prior art.

This object may be achieved by means of a detector according to the attached claims.

SUMMARY OF THE INVENTION

In an embodiment of the present invention, an above disadvantage of prior art may be eliminated by the addition of a transistor function in the lateral detector, which function amplifies the current generated by the radiation and thereby substantially increases the sensitivity of the detector. This may be achieved by arranging at least one additional barrier layer in the lateral detector according to the above description. These new barrier layers have a type of conductivity, which is the opposite of that of the original layer in the point where the layers are applied, and they are electrically biased to be conductive when the original barrier layer is electrically forwardly biased so as to block the current (reversely biased). In addition, these barrier layers are arranged in such manner that the radiation-generated current, besides having to pass the previously mentioned conductive layers, also has to pass these new barrier layers on its way to the collecting electrodes. The current produced by the radiation-generated charge carrier pairs (base current) will be amplified by the transistor function during its passage through the barrier layers, and the amplified current will be split-up in the conductive layers in the way described above on its way to the collecting electrodes, said division forming the basis for determining the location of the irradiated point.

Furthermore, it is advantageous to design the collecting electrode as a base in an additional transistor obtained by introduction of additional doped barrier layers. This transistor can be used to further amplify the already amplified and divided, radiation-generated current.

The barrier layers can be manufactured either by doping the base material of the detector wafer with impurities in such manner that its conductivity parameters (type of conductivity and conductibility) are altered or by using different semiconductor materials having different band gaps in the different conductive layers. The latter way, involving so-called heterojunctions, may improve the electrical properties of the transistor.

A large number of embodiments of the invention are conceivable within the scope of the invention as defined in the appended claims. In particular many different configurations of the barrier layers, the conductive layers and the collecting electrodes of the device are possible.

BRIEF DESCRIPTION OF THE DRAWINGS

A number of embodiments will be described below, by way of example, with reference to the accompanying drawings, in which.

DESCRIPTION OF PREFERRED EMBODIMENTS

Figure 1:
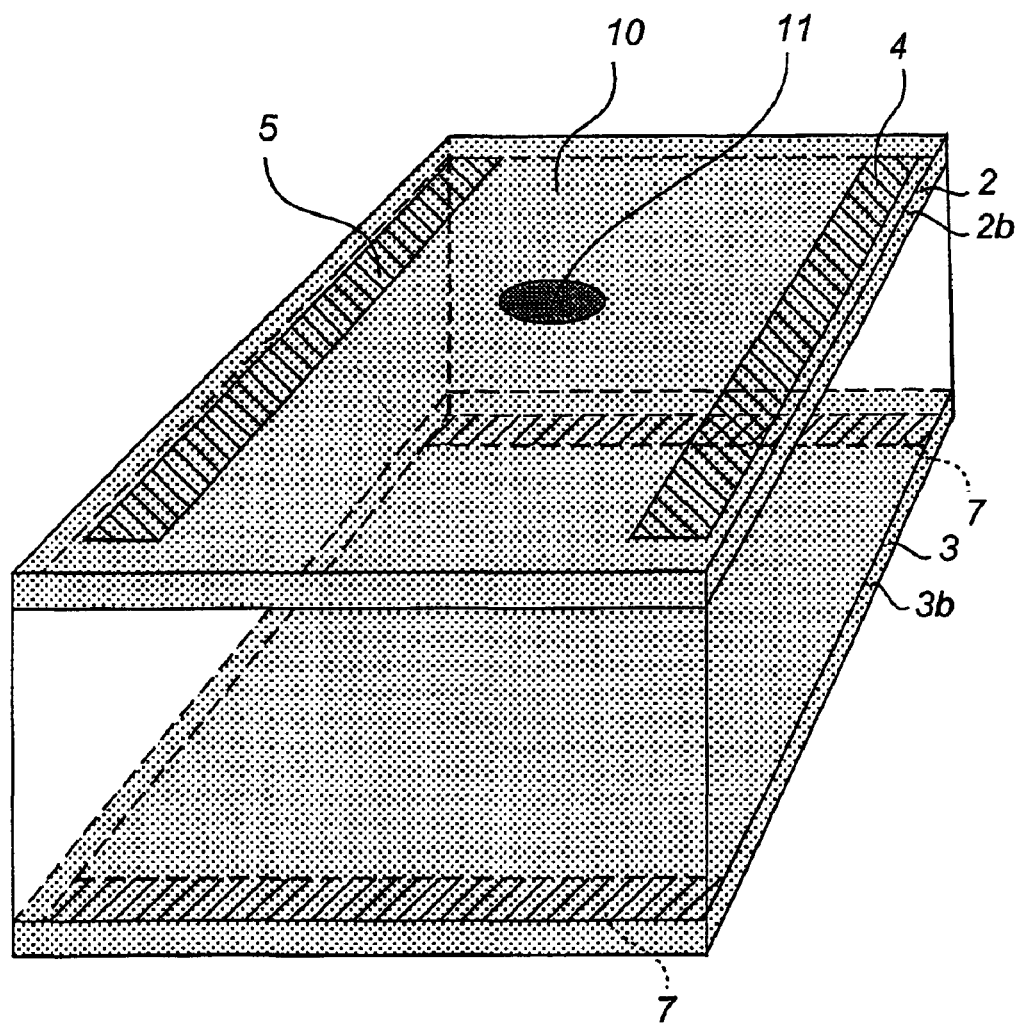
FIG. 1 is a perspective view of a device according to a first embodiment of the invention.
Figure 2A:
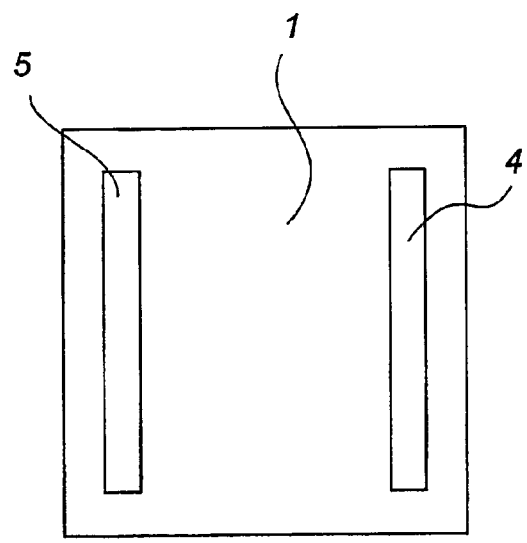
FIGS. 2a–c are plan views of the same embodiment as in FIG. 1.
Figure 2B:
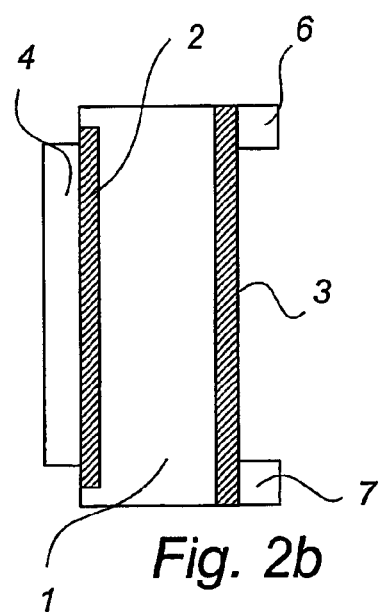
Figure 2C:
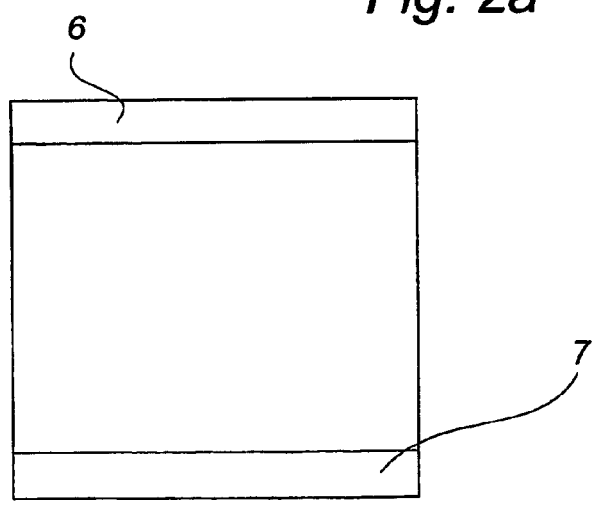
Figure 3:
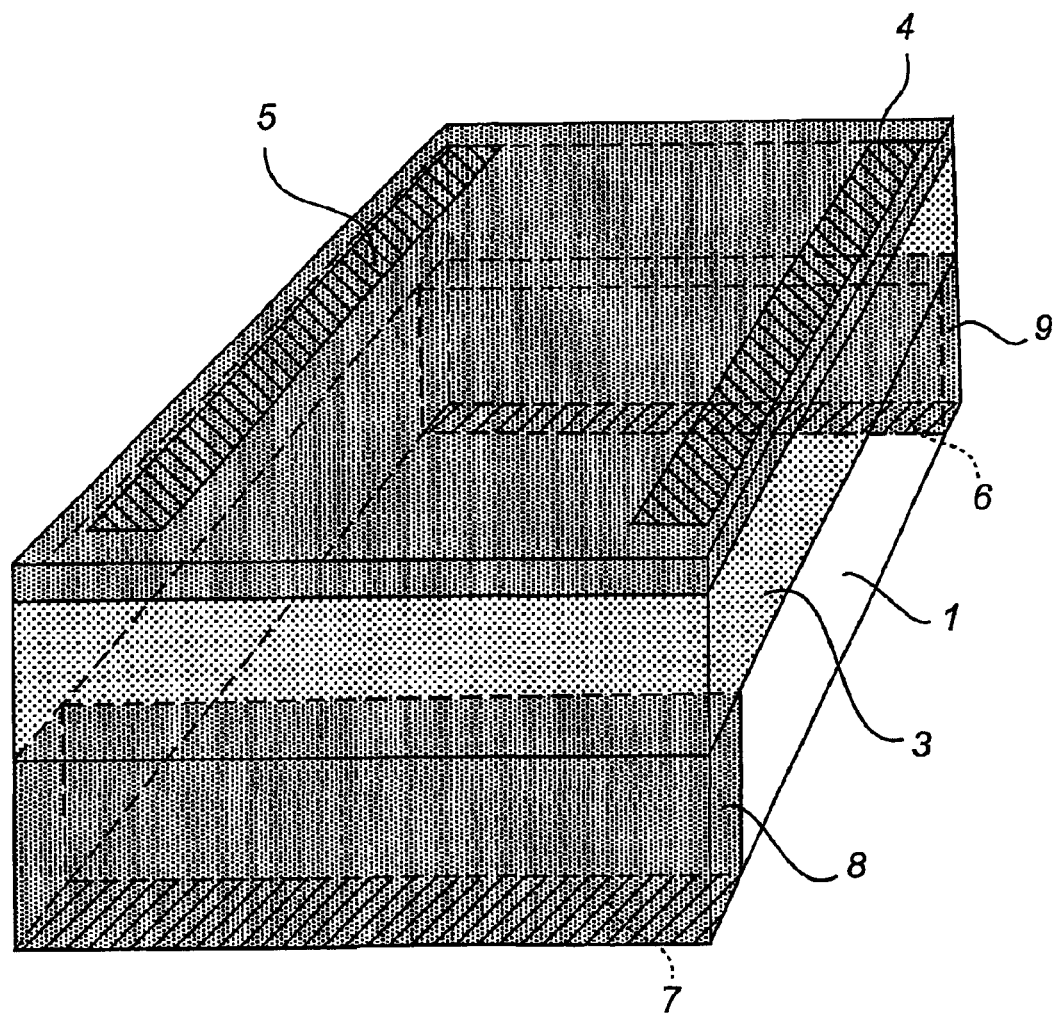
FIG. 3 is a perspective view of a device according to a second embodiment of the invention.
Figure 4A:
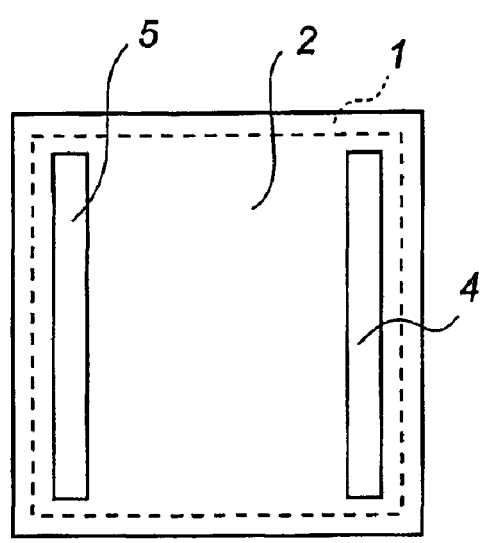
FIGS. 4a–c are plan views of the same embodiment as in FIG. 3.
Figure 4B:
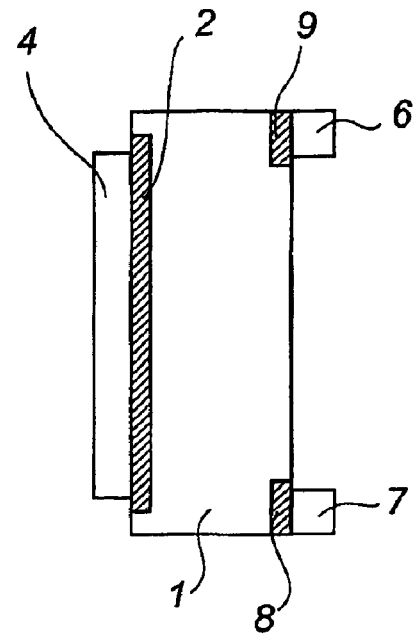
Figure 4C:
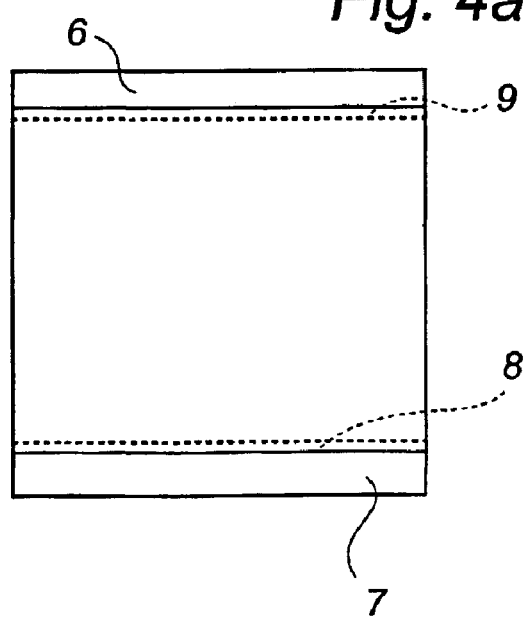
Figure 5:
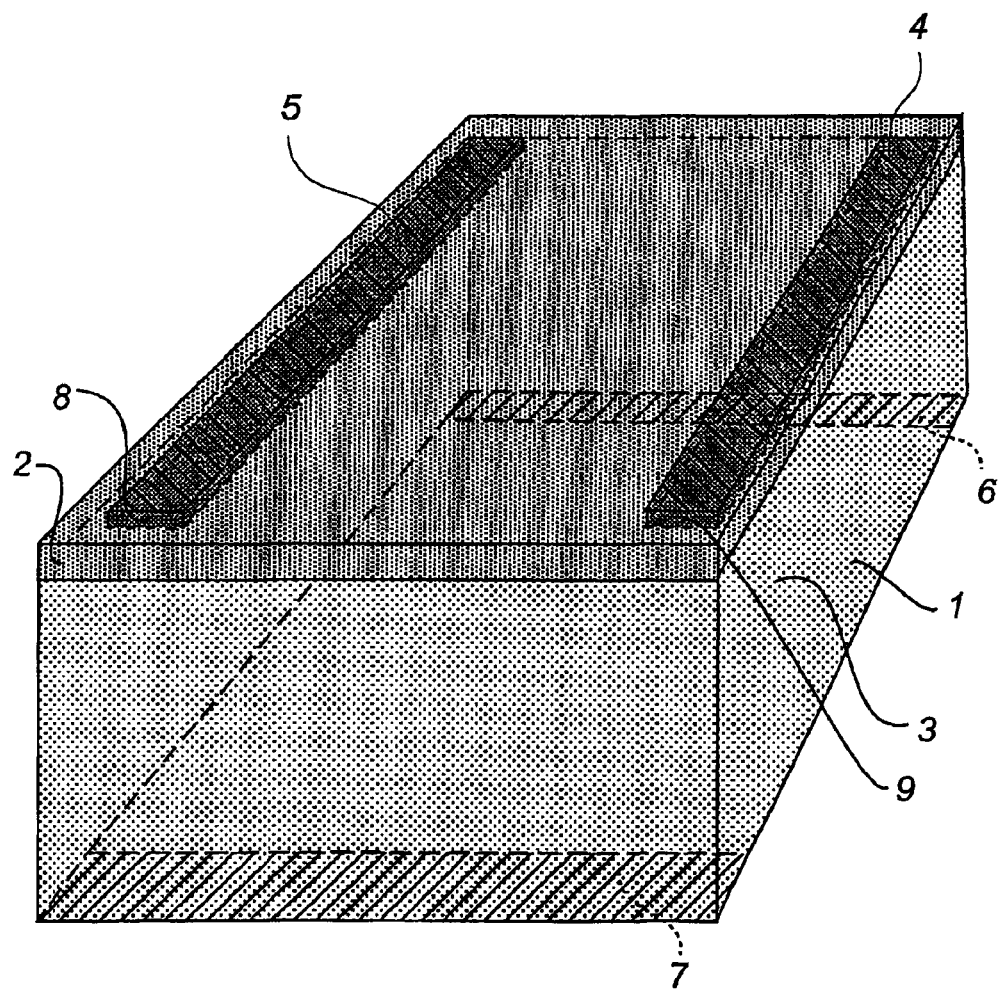
FIG. 5 is a perspective view of a device according to a third embodiment of the invention.
Figure 6A:
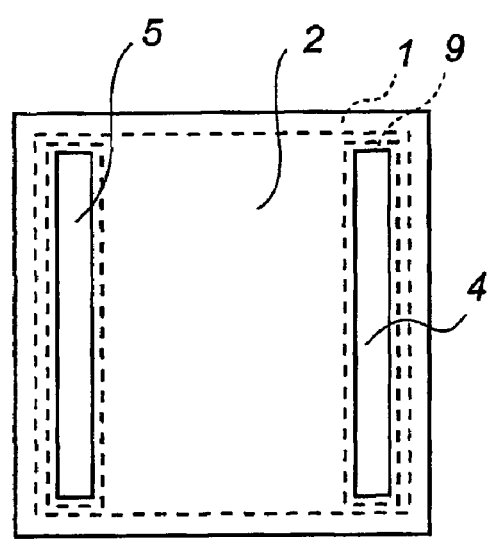
FIGS. 6a–c are plan views of the same embodiment as in FIG. 5.
Figure 6B:
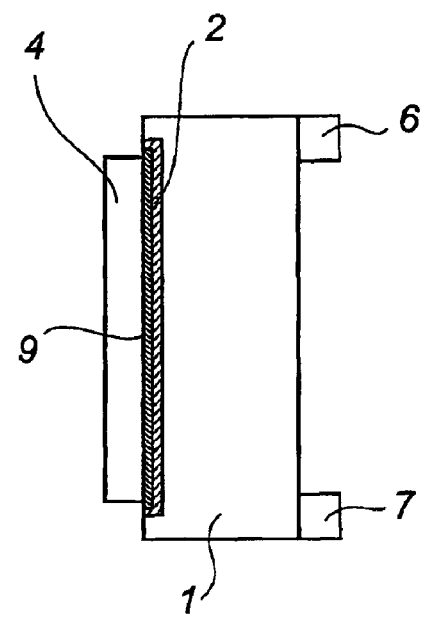
Figure 6C:
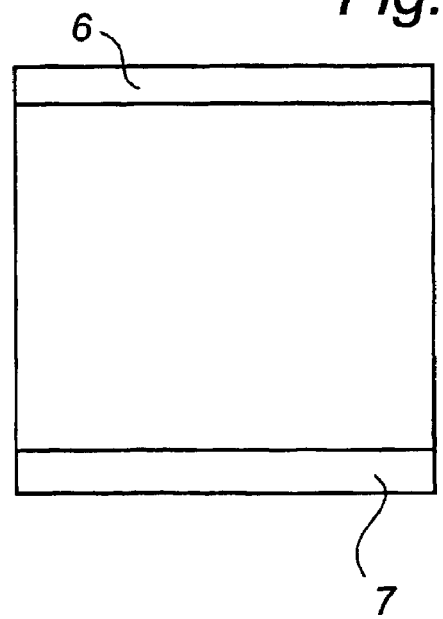

A first embodiment of the device according to the invention, as shown in FIGS. 1 and 2a–c, comprises a semiconductor wafer 1 of a conductivity type n or p with two conductive layers 2 and 3 on either side of the wafer obtained by means of doping. The conductivity type of the doped areas has been selected so as to be the opposite of that of the semiconductor wafer. If, for example, the wafer is of N-type, then the doping of the layer is of P-type. The inverse relation is also possible. In this way, the conductive layers will also constitute barrier layers. Pairs of electrodes 4 & 5 and 6 & 7 respectively are arranged on the conductive layers. The electrodes should be arranged two by two in parallel, and in such manner that each pair extends in a different direction, said direction being preferably perpendicular to that of the other pair. Furthermore, the electrodes are preferably so designed and arranged that each of the two pairs defines two opposite sides of an orthogonal square, which defines two opposite parallel parts of the conductive layers.

In the above example, the barrier layers 2, 3 also serve as conductive layers, to which the electrodes are connected. However, it is also possible to use separate conductive layers 2b, 3b. These may be obtained, for example, by providing a layer of a different doping type on top of the barrier layer, or by providing a thin metal layer or the like.

In an alternative embodiment, the electrodes 4 & 5 and 6 & 7 are all arranged on the upper side or the underside of the wafer. In this case, the opposite side has only one collecting electrode.

A voltage is applied between the front side and the rear side of the wafer, the polarization of said voltage being such that the barrier layer of the front side is reversely biased and the barrier layer of the rear side forwardly biased. Together with the semiconductor material of the wafer these two barrier layers now form a transistor, in which the forwardly biased barrier layer 3 constitutes the emitter, the reversely biased barrier layer 2 the collector and the semiconductor material of the wafer between them constitutes the base 1. If this transistor is exposed to radiation concentrated in one point (the radiation being, for example, light or any other electromagnetic radiation), charge carrier pairs consisting of electrons and holes will form in this point. The electric field across the reversely biased barrier layer will separate the holes from the electrons in such manner that one charge type will move towards the front side of the wafer and the other towards the rear side of the wafer. If the electric circuit between front and rear side is then closed via the conductive layers 2 & 3, the electrode pairs 4 & 5, 6 & 7 and external electronic circuitry (not shown), the voltage applied will give rise to a current in this outer circuit. Owing to the transistor function of the combined barrier layers, this current will be an amplified copy of the original radiation-generated current. On the basis of the splitting-up of the current that occurs in the conductive layers, the position of the irradiated point can be determined.

Moreover, by providing the base with an electric connection, the intensity of the amplified current can be influenced by means of an outer voltage or current source.

The inverse situation, where the barrier layer 2 is forwardly biased and the barrier layer 3 is reversely biased is also possible. However, the reversely biased layer needs to be arranged close to the radiation sensitive detector surface in those cases where the radiation penetration depth is small.

A second embodiment of the device according to the invention, as shown in FIGS. 3 and 4a–c, comprises a semiconductor wafer 1 of a conductivity type n or p with a conductive layer 2 obtained by means of doping and of the opposite conductivity type to that of the base material of the wafer. This conductivity layer also forms, in the same way as described above, a barrier layer. In the same way as described above, a conductive layer 3 is arranged under the barrier layer. In this embodiment, however, the conductivity type of said layer is the same as that of the base material of the wafer. This layer may be formed of the base material of the wafer. In the same way as described above, electrodes 4, 5 and 6, 7 are arranged in contact with the conductive layers. The device according to this embodiment further comprises additional barrier layers 8 and 9, which are required to provide amplification and which are arranged under the electrodes arranged in contact with the conductive layer 3. These barrier layers have the opposite conductivity type to that of the conductive layer where they are applied.

According to a third embodiment of the invention, the additional barrier layers 8, 9 may alternatively be arranged under the electrodes arranged in contact with the conductive layer 2, as shown in FIG. 5 and FIGS. 6a–c.

In the same way as described above, the radiation-generated current in the two latter embodiments will be amplified and divided, on the basis of which it is possible to determine the location of the irradiated point.

Figures 7A, 7B, 7C:
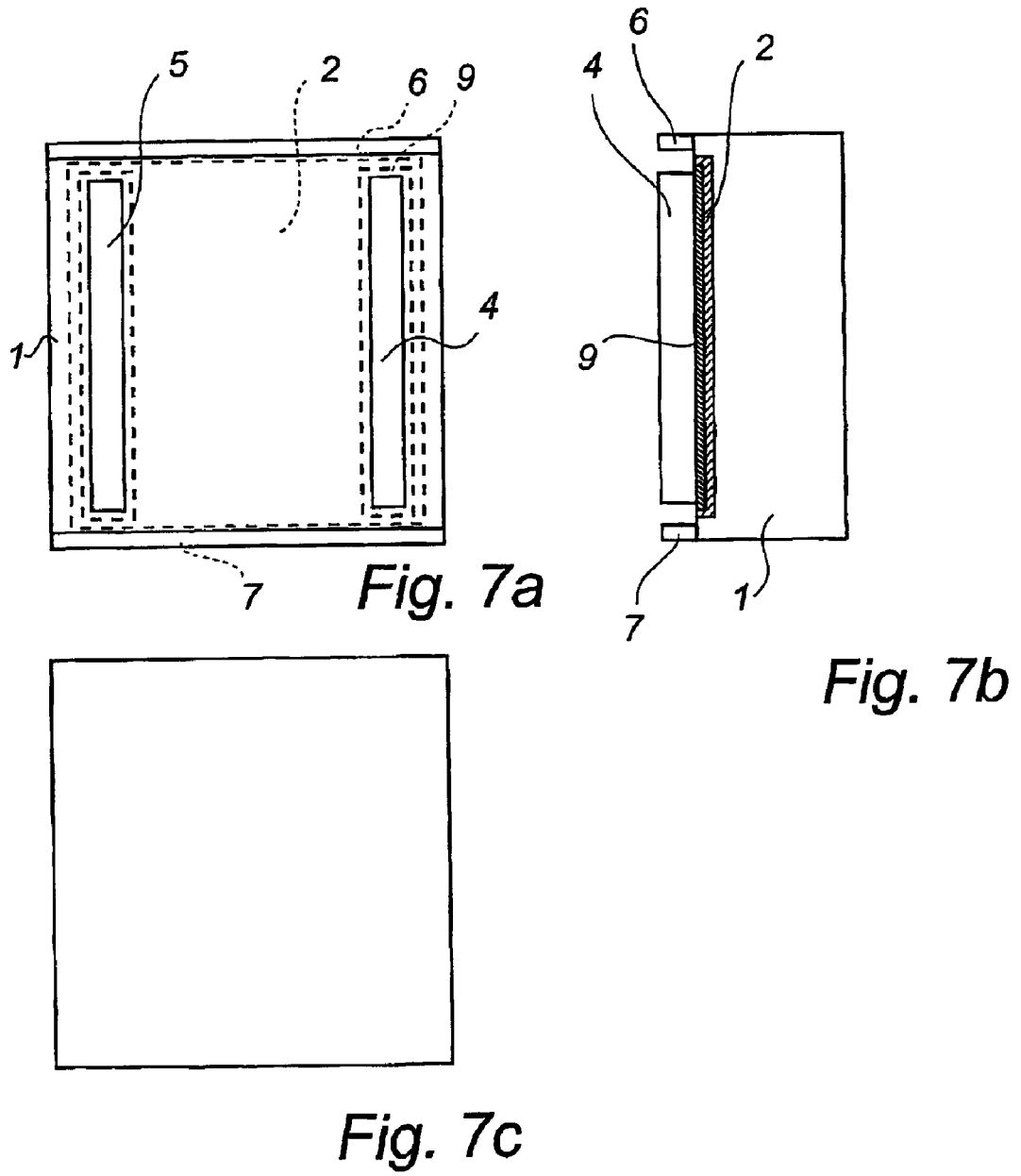
FIGS. 7a–c are plan views of a fourth embodiment of the invention.

FIG. 7 shows a fourth embodiment, in which all the conductive layers are connected from the same side of the semiconductor wafer. As in the previous embodiment, the biased barrier layers may here be arranged under the electrodes in contact with either the layer 2 or the layer 3.

The detector according to the invention constitute a detector, which is far more sensitive than prior art detectors, and which is thus suitable for measurements over large distances or measurements on dark surfaces with low reflectivity. For example, the detector is well suited for triangulation systems and the like.

The invention has been described above by means of embodiments. Several other variants are possible, however, such as arranging the barrier layers in still other places on the supporting semiconductor substrate, providing additional barrier layers, providing additional electrode pairs, etc. Furthermore, it is possible to either have the barrier layer serve as a conductive layer or arrange a separate conductive layer on top of the barrier layer. Such obvious embodiments must be considered to fall within the scope of the invention as defined in the appended claims.

The invention being thus described, it will be obvious that the same may be varied in many ways. Such variations are not to be regarded as a departure from the spirit and scope of the invention, and all such modifications as would be obvious to one skilled in the art are in the scope of the following claims.

What is claimed is:

1. A radiation detector of the type, which by use of electric signals indicates the position of an irradiated point on a detector surface of the detector, comprising:
   a semiconductor wafer having at least two barrier layers, arranged in such manner that, when applying an electric bias across the layers, one layer is reversely biased and the other is forwardly biased, the extension of the reversely biased barrier layer substantially coinciding with the detector surface; and
   at least two conductive layers provided with at least one current collecting electrode the conductive layers being arranged so as to allow a transistor amplification between the forwardly and the reversely biased layer by use of charge currents generated by the radiation in the irradiated point and separated by the reversely biased barrier layer.

2. A radiation detector according to claim 1, further comprising:
   an outer electric connection, arranged so as to provide current paths connecting the two sides of the reversely biased barrier layer, said current paths passing the conductive layers and the forwardly biased barrier layers in such a way that transistor amplification of the currents occurs by interaction of the two barrier layers and that resistive splitting-up of the current between the collecting electrodes occurs in the conductive layers in inverse proportion to the distance from the point where the current was generated.

3. A device according to claim 1, wherein the reversely biased barrier layer, together with one of the conductive layers provided with at least one current collecting electrode, is arranged on one side of the wafer, wherein the forwardly biased barrier layer, together with the other conductive layer provided with at least two current collecting electrodes, is arranged under the reversely biased barrier layer, and wherein the current collecting electrode makes contact with this conductive layer either from the upper side of the wafer or from the rear side of the wafer.

4. A device according to claim 1, the reversely biased barrier layer, together with one of the conductive layers provided with at least two current collecting electrodes, is arranged on one side of the wafer, wherein the forwardly biased barrier layer, together with the other conductive layer provided with at least one current collecting electrode, is arranged under the reversely biased barrier layer, and wherein the current collecting electrode makes contact with this conductive layer either from the upper side of the wafer or from the underside of the wafer.

5. A device according to claim 1, wherein the reversely biased barrier layer, together with one of the conductive layers provided with at least two current collecting electrodes, is arranged on one side of the wafer, wherein the forwardly biased barrier layer together with the other conductive layer provided with at least two current collecting electrodes, is arranged under the reversely biased barrier layer, and wherein the current collecting electrodes make contact with this conductive layer either from the upper side of the wafer or from the underside of the wafer.

6. A device according to claim 1, wherein the forwardly biased barrier layer is divided in such manner that a barrier layer is arranged under each current collecting electrode and in contact with the conductive layer associated with the forwardly biased barrier layer.

7. A device according to claim 1, wherein the forwardly biased barrier layer is divided in such manner that a barrier layer is arranged under each current collecting electrode and in contact with the conductive layer associated with the reversely biased barrier layer.

8. A device according to claim 1, wherein each barrier layer is obtained by joining different semiconductor materials.

9. A device according to claim 1, wherein at least one of the barrier layers is doped in such manner that it also works as a conductive layer.

10. A device according to claim 1, wherein the collecting electrode further forms a base of a further transistor, the base collecting the previously amplified and split-up, radiation-generated current, and the emitter and collector of the transistor preferably consisting of additional barrier layers arranged in the semiconductor wafer.

11. A device according to claim 2, wherein the reversely biased barrier layer, together with one of the conductive layers provided with at least one current collecting electrode, is arranged on one side of the wafer, wherein the forwardly biased barrier layer, together with the other conductive layer provided with at least two current collecting electrodes, is arranged under the reversely biased barrier layer, and wherein the current collecting electrode makes contact with this conductive layer either from the upper side of the wafer or from the rear side of the wafer.

12. A device according to claim 2, wherein the reversely biased barrier layer, together with one of the conductive layers provided with at least two current collecting electrodes, is arranged on one side of the wafer, wherein the forwardly biased barrier layer, together with the other conductive layer provided with at least one current collecting electrode, is arranged under the reversely biased barrier layer, and wherein the current collecting electrode makes contact with this conductive layer either from the upper side of the wafer or from the underside of the wafer.

13. A device according to claim 2, wherein the reversely biased barrier layer, together with one of the conductive layers provided with at least two current collecting electrodes, is arranged on one side of the wafer, wherein the forwardly biased barrier layer together with the other conductive layer provided with at least two current collecting electrodes, is arranged under the reversely biased barrier layer, and wherein the current collecting electrodes make contact with this conductive layer either from the upper side of the wafer or from the underside of the wafer.

14. A device according to claim 1, wherein the forwardly biased barrier layer is divided in such manner that a barrier layer is arranged under each current collecting electrode and in contact with the conductive layer associated with the forwardly biased barrier layer.

15. A device according to claim 2, wherein the forwardly biased barrier layer is divided in such manner that a barrier layer is arranged under each current collecting electrode and in contact with the conductive layer associated with the reversely biased barrier layer.

16. A device according to claim 2, wherein each barrier layer is obtained by joining different semiconductor materials.

17. A device according to claim 2, wherein at least one of the barrier layers is doped in such manner that it also works as a conductive layer.

18. A device according to claim 2, wherein the collecting electrode further forms a base of a further transistor, the base collecting the previously amplified and split-up, radiation-generated current, and the emitter and collector of the transistor preferably consisting of additional barrier layers arranged in the semiconductor wafer.

* * * * *